US010524378B2

(12) United States Patent
Kapoor et al.

(10) Patent No.: US 10,524,378 B2
(45) Date of Patent: Dec. 31, 2019

(54) LATCH ROTATION TO SECURE BLADE SERVER TO ENCLOSURE

(71) Applicant: HEWLETT PACKARD ENTERPRISE DEVELOPMENT LP, Houston, TX (US)

(72) Inventors: Mark Vinod Kapoor, Houston, TX (US); John Norton, Houston, TX (US); Owen Oliver Kidd, Houston, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 15/773,163

(22) PCT Filed: Dec. 8, 2015

(86) PCT No.: PCT/US2015/064424
§ 371 (c)(1),
(2) Date: May 2, 2018

(87) PCT Pub. No.: WO2017/099724
PCT Pub. Date: Jun. 15, 2017

(65) Prior Publication Data
US 2018/0332729 A1    Nov. 15, 2018

(51) Int. Cl.
*G06F 1/16* (2006.01)
*H05K 5/00* (2006.01)
*H05K 7/00* (2006.01)
*H05K 7/14* (2006.01)

(52) U.S. Cl.
CPC .................. *H05K 7/1489* (2013.01)

(58) Field of Classification Search
CPC .. H05K 7/1485; H05K 7/1487; H05K 7/1488; H05K 7/1489

USPC ......................... 361/679.41–679.44
See application file for complete search history.

(56) References Cited

U.S. PATENT DOCUMENTS

| 6,674,651 | B2 | 1/2004 | Momiyama et al. |
| 6,992,897 | B2* | 1/2006 | Shimada ................ G06F 1/181 312/223.1 |
| 7,684,199 | B2* | 3/2010 | Yee .......................... H02B 1/36 361/725 |
| 8,978,245 | B2 | 3/2015 | Dittus et al. |
| 9,271,415 | B2* | 2/2016 | Cerniglia ................ G06F 1/183 |

(Continued)

FOREIGN PATENT DOCUMENTS

| JP | 2009032068 A | 2/2009 |
| JP | 2012077586 A | 4/2012 |

OTHER PUBLICATIONS

International Search Report and Written Opinion, International Application No. PCT/US2015/064424, dated Aug. 24, 2016, pp. 1-10, KIPO.

*Primary Examiner* — Anthony M Haughton
(74) *Attorney, Agent, or Firm* — Hewlett Packard Enterprise Patent Department

(57) ABSTRACT

Examples herein disclose an apparatus for securing or disengaging a blade server in an enclosure. The apparatus includes a worm gear and a cam gear. The worm gear includes a number of threads to interact with a number of teeth on the cam gear. The cam gear includes the number of teeth to interact with the number of threads and a latch. The latch rotates based on the number of threads interacting with the number of teeth such that the rotation secures or disengages the blade server from the enclosure.

8 Claims, 7 Drawing Sheets

(56) References Cited

U.S. PATENT DOCUMENTS

2008/0304224 A1   12/2008   Della et al.
2009/0103258 A1   4/2009   Signer et al.
2010/0086341 A1   4/2010   Yokoyama et al.
2012/0124870 A1   5/2012   Seda
2012/0200979 A1   8/2012   Miller et al.
2014/0001937 A1   1/2014   Cerniglia et al.

* cited by examiner

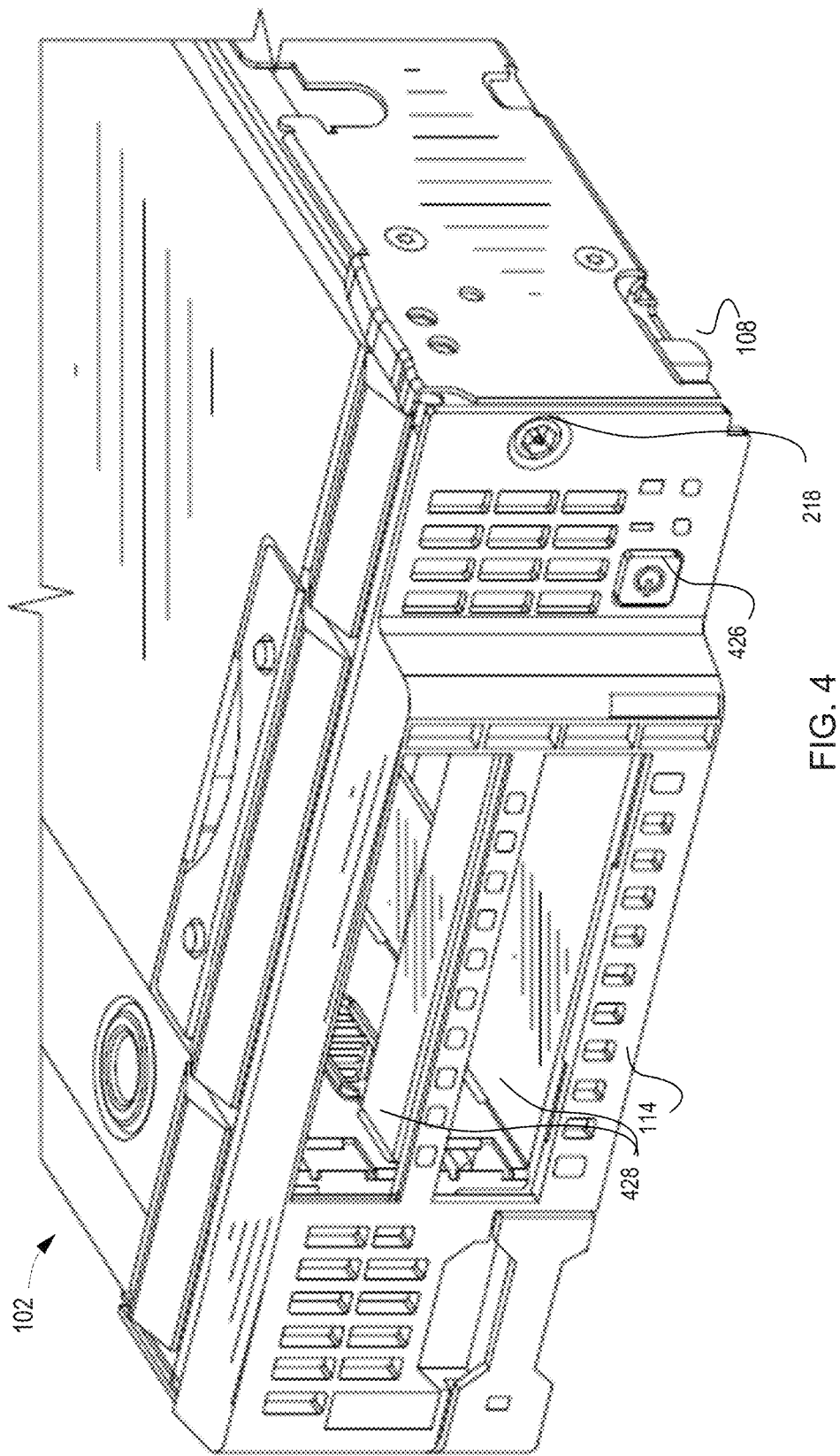

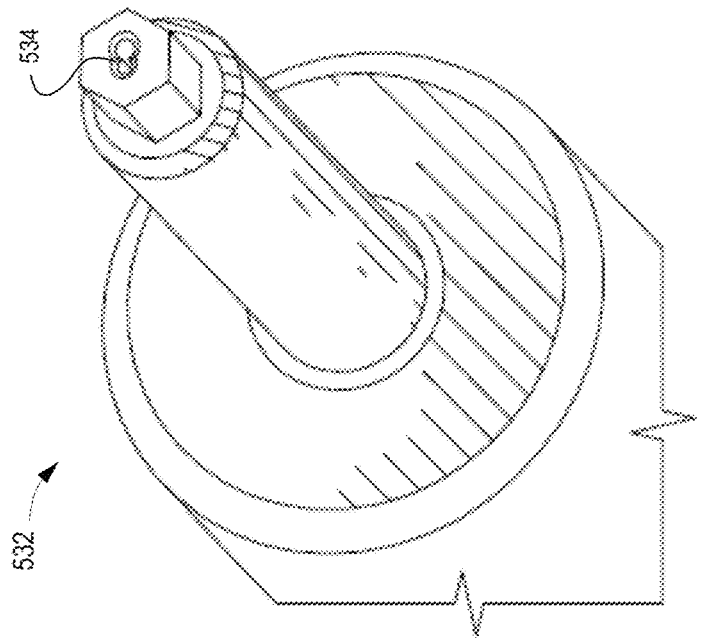
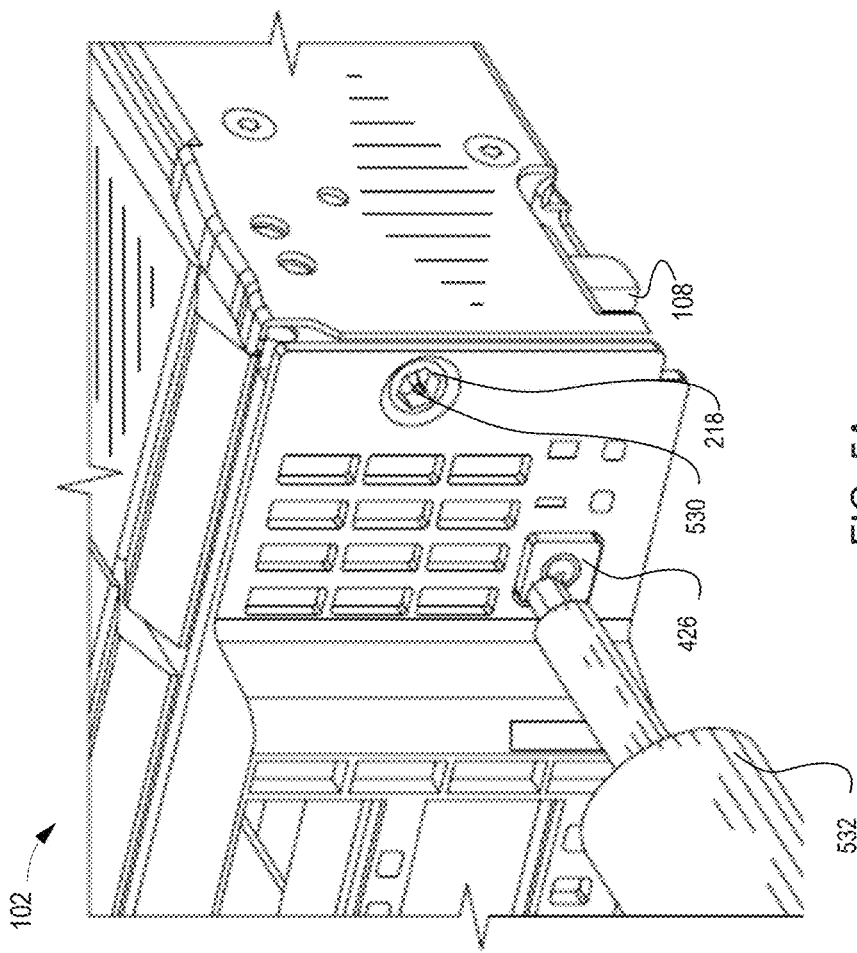
FIG. 5A
FIG. 5B

LATCH ROTATION TO SECURE BLADE SERVER TO ENCLOSURE

BACKGROUND

Rack systems enable high-density computer systems in which processing units, storage units, and other peripheral devices are provided as modules, also referred to as blade servers. These blade servers may be readily added, removed, replaced, or upgraded without having to replace the rack system.

BRIEF DESCRIPTION OF THE DRAWINGS

In the accompanying drawings, like numerals refer to like components or blocks. The following detailed description references the drawings, wherein:

FIG. 4 illustrates a front perspective of an example blade server including a bezel head to actuate a latch;

FIGS. 5A-5B illustrate a front perspective of an example blade server including a bezel head and an interface tool to cause a rotation of the bezel head;

DETAILED DESCRIPTION

Blade servers may slide into a blade enclosure and be latched into place. These blade servers provide the computing capability while the enclosure provides the power, cooling, and network management. The blade servers may be readily removed or installed within the enclosure. Readily removing and installing blade servers may introduce security concerns in a data center.

Geared latched assemblies may be used to latch the blade server into the enclosure; however, gear latched assemblies may cause connection reliability concerns. For example, the blade server may be slammed into the enclosure causing mid-plane flexing and unmated connections in adjacent server blades.

To address these issues, examples provide an apparatus internal to a blade server for installation and removal from the enclosure. The apparatus includes a worm gear with a number of threads and a cam gear with a number of teeth. Based on a rotation of the worm gear, the number of threads interact with the number of teeth which causes a transfer of torque to rotate a latch. Causing the latch rotation based on the interaction, provides a controlled installation technique of the blade server into the enclosure. Controlling the installation technique, produces a repeatable and reliable connection. Additionally, controlling the latch rotation prevents the exposure of excessive force to the blade server.

In another example, to initiate the interaction between the worm gear and the cam gear, a bezel head may be actuated. The bezel head may be actuated through a security interface tool specialized to each particular blade server. In this example, the interface tools is specialized to mate with a mechanism (e.g., lobe) to actuate the bezel head. Using the interface tool for actuation of the bezel head prevents a standard tool from being used. The interface tool limits to administrators with removal and installation privilege.

Figure 1:
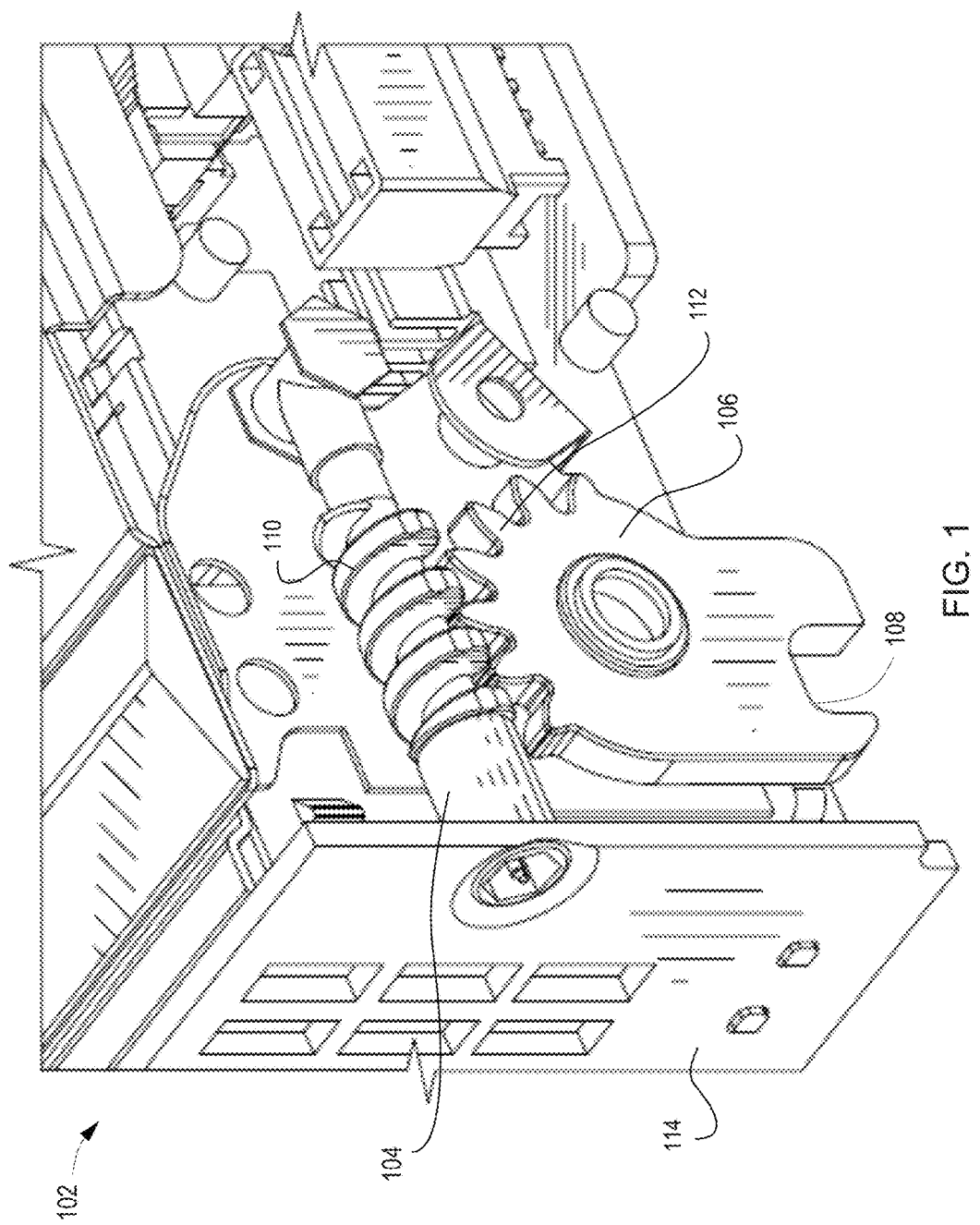
FIG. 1 illustrates a cross-sectional view of an example blade server including a worm gear interaction with a cam gear.

FIG. 1 illustrates a side perspective of an example blade server 102. The blade server 102 includes a worm gear 104 with a number of threads 110 to interact with a number of teeth 112 as part of a cam gear 106. Based on the interaction between the number of threads 110 and the number of teeth 112, a latch 108 rotates in a manner which allows for a removal and installation of the blade server 102 from a blade enclosure (not illustrated). The blade enclosure is a physical chassis which may hold a single or multiple blade servers. The blade enclosure provides services to each of the blade server(s) such as power, cooling, networking, and other various interconnects and management functionalities. The multiple blade servers and the blade enclosure may also be referred to a blade system. As such, the terms blade enclosure and enclosure may be used interchangeably throughout this document.

The blade server 102 is a modularly designed server including a self-contained computing system which may fit collectively in the enclosure with other blade servers. As such, the blade server 102 may include additional circuitry and computing components (not illustrated) to provide services within a data center. In one implementation, the front 114 of the blade server 102 includes a bezel head to actuate for causing the interaction between the number of threads 110 and the number of teeth 112. This implementation may be discussed in detail in later figures.

The worm gear 104 is a slender shaft with raised helical threads (i.e., number of threads 110) running around the body of the shaft and with a slotted head (e.g., bezel head) used to join with the teeth 112 on the cam gear 106 through rotation of the threads 110. The worm gear 104 is held tightly in place by a bushing guide to prevent movement of the gear 104 over a distance. The bezel head and the bushing guide may be explained in later figures.

The worm gear 104 rotates in place to engage the number of threads 110 with the number of teeth 112. In this implementation, the worm gear 104 is considered a screw which interacts with the cam gear 106 by way of threads 110 and teeth 112. As such, the worm gear 104 may be referred to as the worm screw and the cam gear 106 as the worm wheel. The worm gear 104 includes the number of threads 110 which physically engage with the number of teeth 112 on the cam gear 106. The physical engagement between these components 110 and 112 provides the connection which causes the latch 108 to rotate. In one implementation, the number of threads 110 are aligned as right handed threads. In this implementation, a rotation of the worm gear 104 in a clockwise manner causes the number of threads 110 to interact with the number of teeth 112, thus causing the rotation of the latch 108 to secure to a pin. Securing the latch 108 to the pin, allows for installation of the blade server 102 into the enclosure. In another implementation, the number of threads 110 are aligned as left-handed threads thus rotation the worm gear 104 in a counter-clockwise manner. The counter-clockwise rotation of the number of threads 110 interact with the number of teeth 112 causing the rotation of the latch 108 to disengage from the pin. The disengagement of the latch 108 allows the removal of the blade server 102 from the enclosure.

The cam gear 106 is a rotating machine part which includes the number of cut teeth 112, or cogs, which mesh or interact with the number of threads 110 to transmit torque to the latch 108. The transmission of the torque enables the latch 108 to rotate in the clockwise or counterclockwise manner to secure or disengage to a pin, accordingly. The number of teeth 112 are each of identical shape designed to connect with the helical coils and grooves on the worm gear 104. In another implementation, the number of teeth 112 would include less teeth or no teeth on the bottom half of the cam gear 106. Including a minimal number of teeth 112 on the bottom half of the cam gear 106 ensures the blade server 102 would not be over-torqued into the enclosure. Limiting the number of teeth 112 on the cam gear 106 also provides a controlled installation of the server blade 102 into the enclosure such that prevents exposing the server blade 102 to excessive force.

The latch 108 is a material fastener shaped to rotate around the pin attached to the enclosure. The latch 108 is part of the cam gear 106, such that when the worm gear 104 is torqued with the cam gear 106, the torque is transferred to the latch 106 to rotate. In one implementation, the latch 108 rotates 90 degrees clockwise to secure the blade server 102 to the pin in the enclosure. Securing the blade server 102 allows for installation of the blade server 102 into the enclosure. In another implementation, the latch 108 rotates 90 degrees counter-clockwise to release or disengage the blade server 102 from the pin. Disengaging the blade server 102 allows for the removal of the blade server 102 from the enclosure. The position of the latch 108 in FIG. 1, illustrates the latch 108 in a position which secures the blade server 102 to the pin (not illustrated). As such, securing the blade server 102 into the enclosure, the latch 108 is illustrated in a closed position. The pin, as part of the enclosure, secures the blade server 102 into the enclosure. The pin as part of the enclosure is described in detail in later figures.

Figure 2:
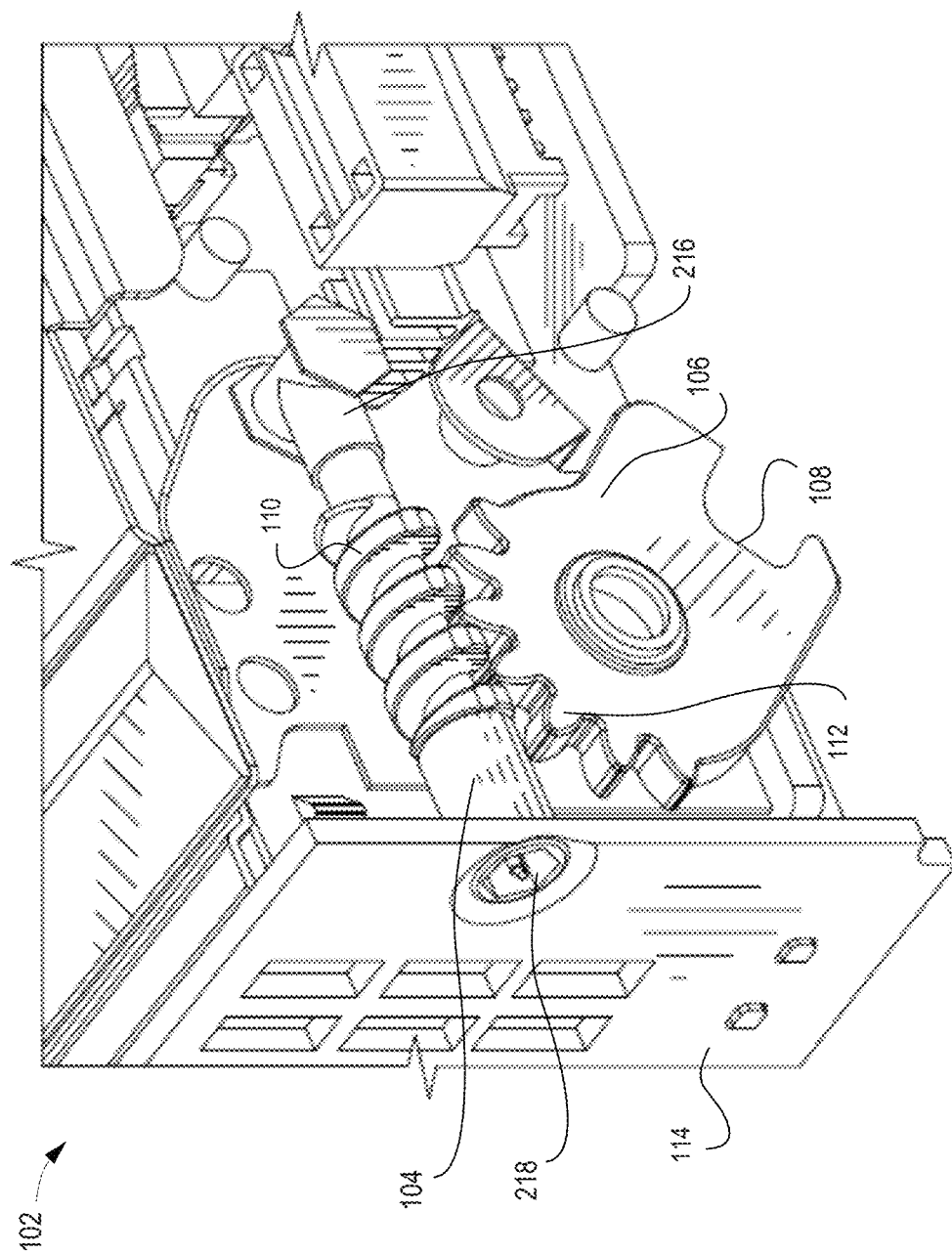
FIG. 2 illustrates a cross-sectional view of an example blade server including a worm gear interacting with a cam gear such that a latch rotates to disengage the example blade server.

FIG. 2 illustrates a side perspective of an example blade server 102 illustrating a position of a latch 108 rotation to disengage from a pin (not illustrated). The disengagement of the latch 108 allows for a removal of the blade server 102 from the enclosure. The worm gear 104 is torqued such that the number of threads 110 rotate and interact with the number of teeth 112 on the cam gear 106. Upon the torquing of the worm gear 104, the number of teeth 112 rotate counter-clockwise, which transfers force to the latch 108. The latch 108 rotates in a counter-clockwise manner, thus allowing for the release or disengagement of the latch 108. The disengagement of the latch 108 is illustrated in an open position, thus allowing for the removal of the blade server 102 from the enclosure.

As explained in FIG. 1, a bushing guide 216 is a mechanical structure designed to support the worm gear 104. The worm gear 104 is held tightly in place by the bushing guide 216 to prevent movement of the worm gear 104 over a distance. In this implementation, one end of the worm gear 104 is placed within the bushing guide 216 to prevent the worm gear 104 from moving out of place. The bushing guide 216 supports the worm gear 104 such the worm gear 104 rotates, but prevents movement over the distance.

A bezel head 218, as part of the worm gear 104, is located on the opposite end from the bushing guide 216. The bezel head 218 may be accessed from the front 114 of the server 102 for actuation. By actuating or initiating a rotation of the bezel head 218, the worm gear 104 rotates to ensure contact with the number of teeth 112 on the cam gear 106.

Figure 3A:
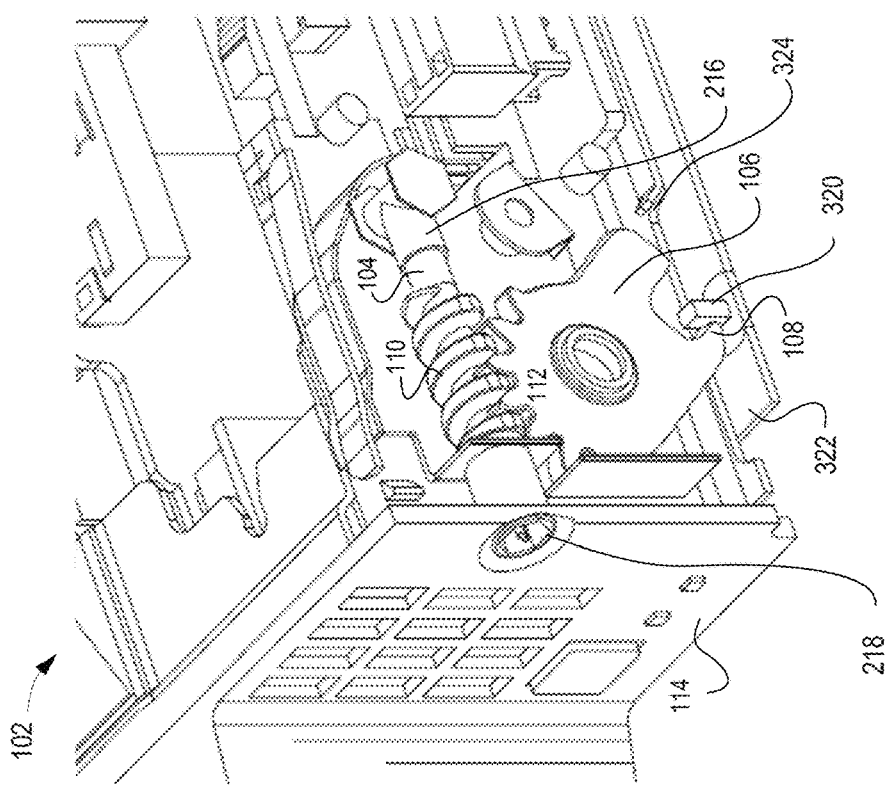
FIGS. 3A-3B illustrate a cross-sectional view of an example blade server including a rotation of a latch to secure or disengage with a pin located on an enclosure.
Figure 3B:
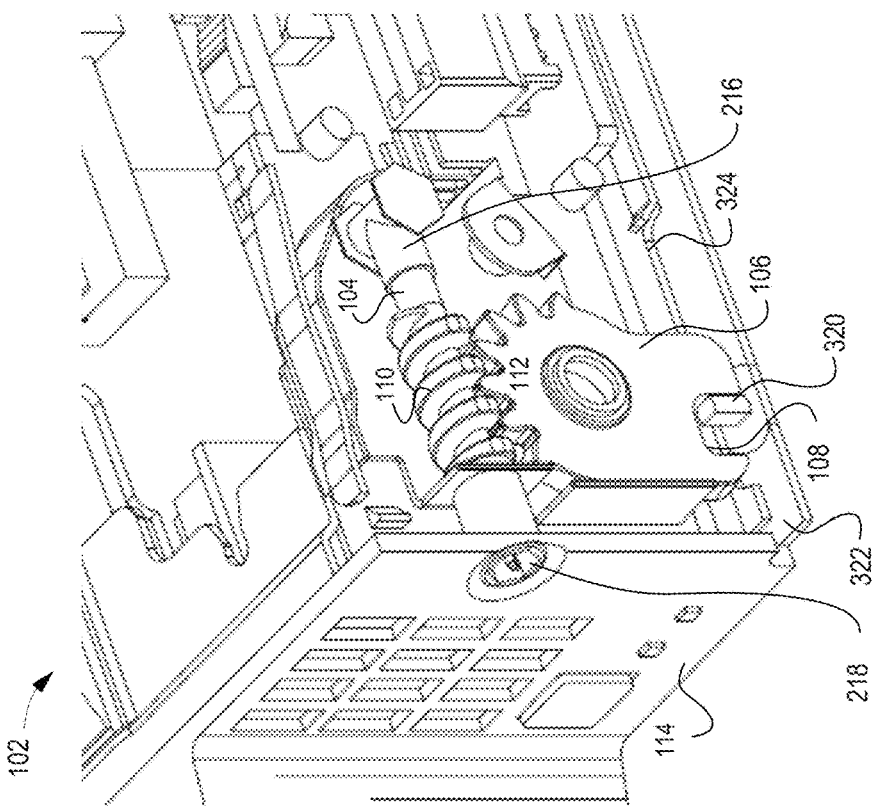

FIGS. 3A-3B illustrate a cross-sectional view of an example blade server 102 including a latch 108 to secure or disengage with a pin 320 located on an enclosure 322. The latch 108 rotates in a clockwise and counter-clockwise manner for installation and removal of the blade server 102 from the enclosure 322. Additionally, the blade server 102 includes a notch 324 designed to provide additional space for server components internal to the blade server 102. Although FIGS. 3A-3B illustrate the enclosure 322 as limited to the board, implementations should not be limited as for illustration purposes, other supporting walls to the enclosure 322 may not have been illustrated. For example, the enclosure 322 may include a back wall which includes the various interconnections for the blade server 102.

In FIG. 3A, the latch 108 is illustrated in a closed position, such that the latch 108 is rotated to secure to the pin 320. The latch 108 is secured to the pin 320 as part of the installation of the blade server 102 into the enclosure 322. To initiate the latch 108 into the closed position, the bezel head 218 is rotated causing the number of threads 110 on the worm gear 104 to rotate. The rotation of the number of threads 110 interacts with the number of teeth 112 such that the cam gear 112 rotates counter-clockwise. The interaction between the number of teeth 112 and the number of threads 110 produces a torque which is transferred to cause the rotation of the latch 108 to secure to the pin 320.

In FIG. 3B, the latch 108 is illustrated in an open position, such that the latch 108 is rotated to disengage from the pin 320. The latch 108 is released or disengaged from the pin 320 as part of the removal process of the blade server 102 from the enclosure 322. To initiate the latch 108 into the open position, the bezel head 218 is rotated causing the number of threads 110 on the worm gear 104 to rotate. The rotation of the number of threads 110 interacts with the number of teeth 112 such that the cam gear 112 rotates clockwise. The interaction between the number of teeth 112 and the number of threads 110 produces a torque which is transferred to cause the rotation of the latch 108 to disengage from the pin 320 and in turn, the enclosure 322.

FIG. 4 illustrates a front perspective of an example blade server 102 including a bezel head 218 to actuate a latch 108. The blade server 102 includes a front chassis 114 which may hold various hard drives 428 and a power button 426. The bezel head 218 includes a lobe in the center which may be actuated for rotation with a specialized interface tool. This may be discussed in detail in the next figures.

Upon the rotation of the bezel head 218, threads on a worm gear interact with teeth on a cam gear to cause the rotation of the latch 108. The threads, worm gear, teeth, and cam gear are on internal to the front of the server chassis 114.

FIGS. 5A-5B illustrate a front perspective of an example blade server 102 including a bezel head 218 and an interface tool 532. The interface tool 532 connects with a lobe 530 of vary size and shape specific to the blade server 102. The lobe 530 engages with an insert 534 as part of the interface tool 532. The lobe 530 and the insert 534 are designed such that the shape, amount, and size are exclusive to that blade server 102. Thus to initiate the actuation of the bezel head 518, the interface tool 532 would need to correspond to the lobe 530. In this implementation, the lobe 530 and interface tool 532 are exclusive to that blade server 102.

The interface tool 532 functions as a locking mechanism to prevent a standard tool from being used to actuate the bezel head 218 and in turn, the latch 108. To removal or install the blade server 102, the correct interface tool 532 with the inserts 534 aligning with the lobes 530 would be used to actuate the bezel head 218 and in turn the latch rotation 108. Upon the inserts 534 engaging with the lobes 530, the bezel head 218 may be actuated through a clockwise and counter-clockwise manner. Actuating the bezel head 218, rotates the threads on the worm gear to interact with the teeth on the cam gear and in turn, rotates the latch 108 for securing and disengaging the blade server 102 from the enclosure.

Figure 6:
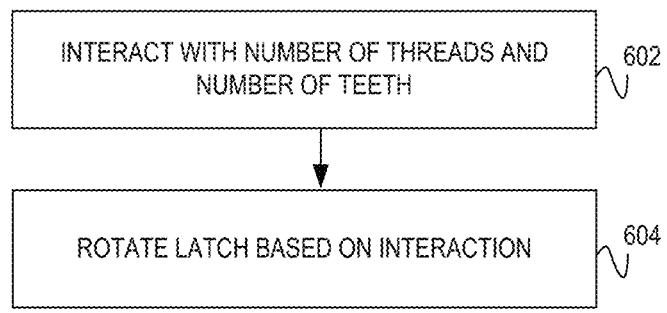
FIG. 6 illustrates an example flowchart to cause an interaction between a number of threads on a worm gear and a number of teeth on a cam gear, the interaction rotates a latch to secure or disengage a blade server.

FIG. 6 illustrates an example flowchart to cause an interaction between physical components in a server blade. The server blade includes a number of threads on a worm gear to interact with a number of teeth on a cam gear. The interaction between the number of threads and the number of teeth causes a latch on the server blade to rotation. The rotation of the latch causes the blade server to secure or disengage from a pin. Securing the blade server to the pin allows for installation of the blade server in the enclosure. Disengaging the blade server from the pin allows the removal of the blade server from the enclosure. In discussing FIG. 6, references may be made to the components in FIGS. 1-5 to provide contextual examples. For example, the blade server 102 includes the components such as the worm gear 104, the cam gear 106, and the latch 108 to perform operations 602-604.

At 602, the number of threads on the worm gear interact with the number of teeth on the cam gear. The interaction is a physical engagement between the threads and the number of teeth such that the engagement causes a rotation on the latch of the cam gear as at operation 604.

At 604 upon the interaction of the number of threads and the number of teeth, the latch rotates to cause an engagement and disengagement of the blade server. The rotation of the latch allows the pin to engage and disengage the blade server from the enclosure. Engaging and disengaging the blade server allows for the removal and insertion.

Figure 7:
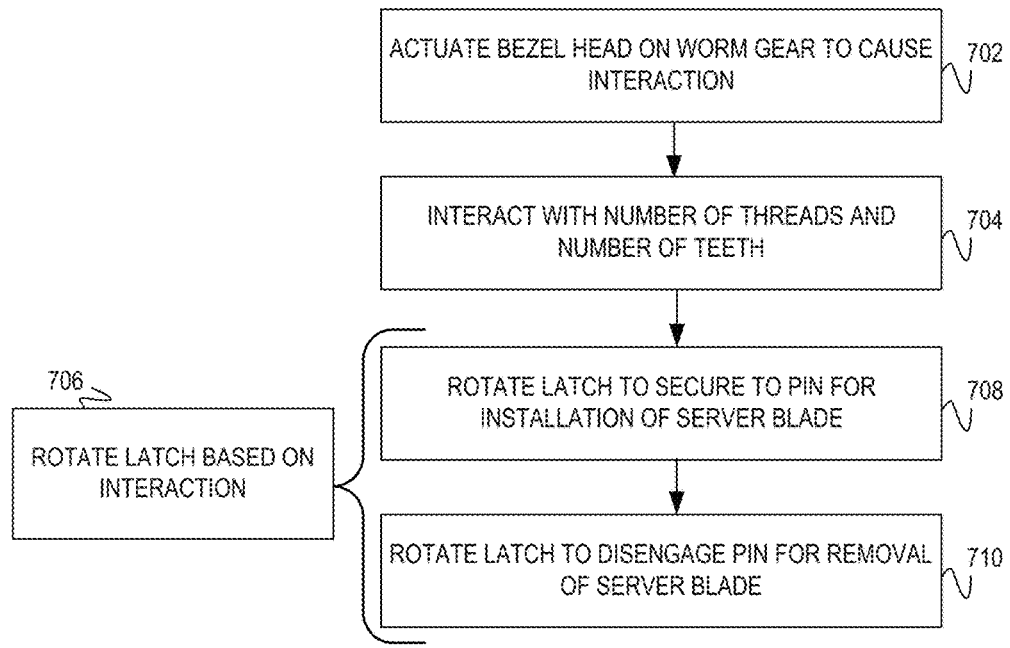
FIG. 7 illustrates an example flowchart to actuate a bezel head on a worm gear causing an interaction between a number of threads on a worm gear and a number of teeth on a cam gear, in turn the interaction rotates a latch for securing or disengaging a blade server from an enclosure, accordingly.

FIG. 7 illustrates an example flowchart to rotate a latch for securing and disengaging a blade server from a blade enclosure. Initially, a bezel head on a worm gear is actuated to cause an interaction between a number of threads on the worm gear and a number of teeth on a cam gear. The interaction causes the latch to rotate thus securing or disengaging the server blade from the blade enclosure. In discussing FIG. 7, references may be made to the components in FIGS. 1-5 to provide contextual examples. For example, the blade server 102 includes the components such as the worm gear 104, the cam gear 106, and the latch 108 to perform operations 702-710.

At operation 702, the bezel head on the worm gear is actuated to cause the number of threads on the worm gear to interact with the number of teeth on the cam gear. In one implementation, the bezel head is actuated by rotating the bezel head such that the threads on the worm gear rotate to physically engage with the teeth on the cam gear as at operation 704. In another implementation, the bezel head may be actuated through a security interface tool specialized for the blade server. In this implementation, the bezel head includes a mechanism unique to each blade server, thus the interface tool is specialized to mate with the mechanism to actuate the bezel head.

At operation 704 based on the bezel head actuation, the number of threads on the worm gear interact with the number of teeth on the cam gear. The number of threads rotates to physically engage with the number of teeth such that each of the number of threads line up in connection with the number of teeth on the cam gear. In one implementation, the threads either rotate in a clockwise or counter-clockwise manner to engage with the number of teeth on the cam gear. This interaction causes the rotation of the latch at operations 706-710. Operation 704 may be similar in functionality to operation 602 as in FIG. 6.

At operation 706 upon the interaction of the number of threads with the number of teeth, the latch within the blade server rotations. In one implementation, the rotation of the latch secures the blade server to a pin. The pin is considered part of the blade enclosure to either secure or disengage the blade server from the enclosure. Securing the blade server to the pin enables the installation of the server blade into the enclosure as at operation 708. In another implementation, the rotation of the latch disengages the blade server from the pin. Disengaging the blade server from the pin allows the removal of the blade server from the enclosure as at operation 710. Operation 706 may be similar in functionality to operation 604 as in FIG. 6.

At operation 708 based on the interaction between the number of threads and the number of teeth, the latch rotates to secure the blade server to the pin in the enclosure. Securing the blade allows for installation of the blade server into the enclosure. In one implementation, the latch rotates clockwise based on the interaction, the clockwise rotation locks the latch as part of the blade server onto the pin on the enclosure. Securing the blade server into the enclosure provides a safety feature for a controlled installation into the enclosure. This prevents exposing the blade server to excessive force which may damage the server and/or the enclosure.

At operation 710 based on the interaction between the number of threads and the number of teeth the latch rotates to disengage the blade server from the pin in the enclosure. Disengaging the blade server from the pin allows for the removal of the blade server from the enclosure. In one implementation, the latch rotates in a counter-clockwise manner such that the latch is released from the pin. Allowing the removal of the blade server from the enclosure based on the interaction, provides a security feature that allows the removal of the blade server by authorized entities.

Although certain embodiments have been illustrated and described herein, it will be greatly appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a variety of ways. This application is intended to cover adaptions or variations of the embodiments discussed herein. Therefore, it is manifestly intended that embodiments be limited only by the claims and equivalents thereof.

We claim:

1. An apparatus that secures or disengages a blade server into an enclosure, the apparatus comprising:
   a worm gear comprising:
      a number of threads to interact with a number of teeth on a cam gear; and
      a number of lobes of differing sizes, located on a bezel head of the worm pear, the number of lobes of differing sizes specific to the blade server;
   the cam gear comprising:
      the number of teeth to interact with the number of threads; and
      a latch to rotate based on the interaction between the number of teeth and the number of threads such that the rotation of the latch secures or disengages the blade server from the enclosure; and an insertion tool specific to the number of lobes, to interact with the number of lobes such that causes the number of threads to interact with the number of teeth.

2. The apparatus of claim 1 comprising:

the bezel head, coupled to the worm gear and located on a front side of the blade server, to receive the insertion tool for rotation of the latch.

3. The apparatus of claim 1 comprising:

a pin to secure and disengage the latch for installation and removal of the blade server latch based on the rotation of the latch.

4. The apparatus of claim 1 wherein the number of threads is threaded as a right hand worm to interact with the number of teeth on the cam gear.

5. The apparatus of claim 1 comprising:

a bushing guide to constrain the worm gear to a position.

6. A system comprising:

a blade server to secure into an enclosure;

a worm gear comprising:

a number of threads on a body of the worm gear;

a bezel head to rotate which causes a number of threads to interact with a number of teeth on a cam gear;

a number of lobes of varying sizes specific to the blade server;

an interface tool, corresponding to the number of lobes of varying sizes specific to the blade server, to cause the rotation of the bezel head; and a cam gear comprising:

a number of teeth to interact with the number of threads based on the rotation of the bezel head; and a latch to rotate, based on the interaction between the number of teeth and the number of threads, such that the rotation of the latch secures the blade server into the enclosure.

7. The system of claim 6 comprising:

a board comprising:

a pin to interact with the latch causing the latch to secure the server blade; and a notch to allow rotation of the latch.

8. The system of claim 6 wherein the number of teeth are in a pattern on the cam gear to prevent overdriving the server blade into a back of the enclosure.

* * * * *